US 6,677,173 B2

(12) United States Patent
Ota

(10) Patent No.: US 6,677,173 B2
(45) Date of Patent: Jan. 13, 2004

(54) METHOD OF MANUFACTURING A NITRIDE SEMICONDUCTOR LASER WITH A PLATED AUXILIARY METAL SUBSTRATE

(75) Inventor: Hiroyuki Ota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 144 days.

(21) Appl. No.: 09/818,941

(22) Filed: Mar. 28, 2001

(65) Prior Publication Data

US 2001/0055324 A1 Dec. 27, 2001

(30) Foreign Application Priority Data

Mar. 28, 2000 (JP) ........................................ 2000-089440

(51) Int. Cl.[7] .............................................. H01L 21/00
(52) U.S. Cl. .......................... 438/22; 438/33; 438/798; 438/463
(58) Field of Search ................................ 438/460–464, 438/455–459, 33, 46, 47

(56) References Cited

U.S. PATENT DOCUMENTS

| | | | | |
|---|---|---|---|---|
| 5,766,695 A | * | 6/1998 | Nguyen et al. | ............. 427/553 |
| 5,985,687 A | * | 11/1999 | Bowers et al. | ................. 438/46 |
| 6,084,895 A | * | 7/2000 | Kouchi et al. | |
| 6,113,685 A | * | 9/2000 | Wang et al. | ..................... 117/3 |
| 6,153,495 A | * | 11/2000 | Kub et al. | ................... 438/459 |
| 6,159,825 A | * | 12/2000 | Henley et al. | .............. 438/460 |
| 6,177,359 B1 | * | 1/2001 | Chen et al. | ................... 438/751 |
| 6,214,750 B1 | * | 4/2001 | Liao et al. | .................... 438/795 |
| 6,239,033 B1 | * | 5/2001 | Kawai et al. | ................ 438/693 |
| 6,278,173 B1 | * | 8/2001 | Kobayashi et al. | ............ 438/33 |
| 6,303,405 B1 | * | 10/2001 | Yoshida et al. | ................ 438/34 |
| 6,379,985 B1 | * | 4/2002 | Cervantes et al. | ............. 438/33 |
| 6,420,242 B1 | * | 7/2002 | Cheung et al. | .............. 438/463 |
| 6,448,102 B1 | * | 9/2002 | Kneissl et al. | ................. 438/46 |
| 6,468,824 B2 | * | 10/2002 | Chen et al. | |

* cited by examiner

Primary Examiner—Savitri Mulpuri
(74) Attorney, Agent, or Firm—Sughrue Mion, PLLC

(57) ABSTRACT

The disclosure is a method of manufacturing a nitride semiconductor laser wherein a plurality of crystal layers made of group III nitride semiconductors, including an active layer, are successively stacked on an underlayer. The method includes the steps of forming the plurality of crystal layers on the underlayer formed on a substrate, forming an electrode layer on the outermost surface of the crystal layers, plating a metal film onto the electrode layer, irradiating an interface between the substrate and the underlayer with light through the substrate toward so as to form a region of decomposed substances of the nitride semiconductor, delaminating the underlayer that supports the crystal layers from the substrate along the decomposed substance region, and cleaving the underlayer with the crystal layers so as to form cleaved planes constituting a laser resonator.

15 Claims, 18 Drawing Sheets

CLEAVAGE PLANE d

METHOD OF MANUFACTURING A NITRIDE SEMICONDUCTOR LASER WITH A PLATED AUXILIARY METAL SUBSTRATE

BACKGROUND OF THE INVENTION

1. Field of the Invention

The present invention relates to group III nitride semiconductor devices (hereinbelow, also expressed simply as "devices"), and more particularly to a method of fabricating a semiconductor laser devices which employs a group III nitride material system.

2. Description of the Related Art

A laser device requires a pair of reflectors or reflecting mirrors for forming an optical resonator to operate. In the case of fabricating semiconductor laser devices (of Fabry-Perot type) using the semiconductor materials such as GaAs etc., the reflecting mirrors are mostly formed by the cleavage of GaAs crystal substrates.

The crystal system of group III nitride semiconductors is one similar to a hexagonal system, called "wurtzite type", unlike the sphalerite type of group III–V semiconductors, but it also has a definite cleavage plane. It is accordingly the best to form a laser device structure on, for example, the GaN bulk crystal substrate.

However, in the case of fabricating a semiconductor laser device by the use of the group III nitride materials, a nitride bulk crystal to be employed as the substrate has not been produced yet. Therefore, the device is inevitably fabricated by expitaxially growing a nitride crystal film as an underlayer on a different kind of substrate of sapphire, SiC or the like.

Heretofore, as methods of fabricating the reflector surfaces of nitride lasers on substrates, the following four 1)–4) have been known:

1) A laser structure of grown nitride films is fabricated on a substrate, and it is shaved by dry etching such as reactive ion etching (RIE), thereby to obtain reflector surfaces. Fabricating a laser structure by growing nitride films on a substrate, then forming reflector mirrors by dry etching such as reactive ion etching (RIE).

2) Growing nitride films the C-plane, namely, (0001) plane or the A-plane, namely, (11$\bar{2}$0) plane (hereafter referred to as (11-20) plane)of a sapphire substrate, and splitting the wafer along the ($1\bar{1}00$) plane (hereafter referred to as (1-100) plane) or ($1\bar{1}02$) plane (hereafter referred to as (1-102) plane) of sapphire substrate, thereby obtain reflector mirrors.

3) Growing a laser structure on a SiC substrate, and thinning the back surface thereof, and cleaving the resultant structure along with the substrate, thereby obtaining reflector mirrors.

4) After growing a thick, for example 100 μm-thick GaN film on a sapphire substrate, removing the sapphire substrate by grinding or lapping, then using the remaining GaN film a substrate crystal on which a laser structure is formed.

Favorable single-crystal films have ever been obtained on the C-plane and A-plane of sapphire. The sapphire substrate is very difficult to be split as compared with a GaAs substrate etc. which have hitherto been employed for a semiconductor laser etc. It has therefore been common practice to avoid the method based on the cleavage, and to obtain the reflective surfaces by the etching (RIE). The sapphire does not have a clear cleavage plane like those of Si, GaAs etc. Regarding the C-plane, however, the sapphire can be tentatively split along the (1-100) plane. Also, regarding the A-plane, it can be split along the (1-102) plane, namely, a so-called "R-plane" favorably in a state considerably close to the cleavage of the ordinary crystal.

Nevertheless, the respective methods 1)–4) have disadvantages as stated below.

Regarding the forming method 1) which employs the RIE, it is difficult to obtain reflective surfaces perpendicular to the waveguide, and also hard to obtain smooth surfaces favorable for the reflector mirrors. Accordingly, the method 1) has the problem that the far field image of emitted light forms multiple spots. In particular, the formation of the multiple spots of the emitted light is ascribable to the fact that the sapphire cannot be effectively etched even by the dry etching such as RIE. As shown in FIG. 1, in a laser device with the reflector surfaces 2 formed by etching, portion of the emitted beam is reflected by the part of a sapphire substrate 3 indicated by (S) in the figure (the part left without being etched), and the reflected light interferes with the main beam, so that the far field image forms the multiple spots. The formation of the multiple spots in the far field image is fatal to a light source for an optical disk system, and hence, a laser device thus fabricated cannot be put into practical use at all.

In the case of forming method 2), the growth on the sapphire C-plane has the troublesomeness that the structure cannot be split unless the sapphire substrate is thinned by polishing the back surface thereof, and has the problem of low reproducibility in the splitting process. These problems are ascribable to the fact that the sapphire (1-100) plane is not the genuine cleavage plane. Since the sapphire is a very hard crystal, it cannot be split along scribing lines without being thinned. More specifically, when it is intended to obtain split surfaces which are practical for a laser device, the sapphire substrate needs to be thinned down to about 100 μm. In the case of polishing the back surface of the substrate on which a laser structure has already been formed the wafer is warped and distorted by the difference between the thermal expansion coefficients of the sapphire and nitrides, or by a residual stress attendant upon the polishing. On account of the warp and the distortion, wafer breakage is very prone to occur during the polishing process. This is very disadvantageous for mass production.

The crystal orientation of the GaN grown on the sapphire C-plane rotates by 30 degrees relative to that of the substrate. Accordingly, when the sapphire substrate is split along the (1-100) plane, the overlying GaN is to be split along the (11-20) plane. Since the cleavage plane of a GaN crystal is the (1-100) plane, the GaN is somewhat forced to be split along the crystal plane not being the cleavage plane, in this case. Owing to the symmetry of the GaN crystal, however, a very good fissured surface is obtained when the splitting is in a direction precisely along the (11-20) plane.

Meanwhile, since the (1-100) plane is not the cleavage plane, the sapphire can also be split even when a scribing line is drawn with a deviation. In this case, the GaN is to be split in a direction deviating from the (11-20) plane.

Therefore, low reflectivity and irregularity in the wave front of emitted light are incurred to deteriorate the quality of the mirror facet for a laser.

Further, the growth on the sapphire A-plane in the forming method 2) has the problem that the quality of the fissured surface of the GaN is unsatisfactory.

Since the R-plane being the (1-102) plane which is the parting plane of the sapphire, the A-plane sapphire can be easily parted even with a thickness of 250–350 μm ordinarily applied to a substrate. However, in the case where, as shown in FIG. 2, a laser structure is formed on the A-plane of the sapphire substrate and is parted from the direction indicated by an arrow, a plurality of fine striations appear on the side surface of the GaN. The appearance of the plurality of striations is ascribable to the fact that the sapphire substrate constitutes most of the thickness of the wafer and the cracks therefore propagates along the R-plane of sapphire crystal. Although the sapphire substrate cracks along its R-plane, the (1-100) plane of the GaN grown on the sapphire A-plane deviates by 2.4 degrees from the sapphire R-plane. Therefore, even after the crack has reached a sapphire/GaN interface, it propagates into the GaN crystal along the R-plane of the underlying sapphire to a slight. However, the GaN tends to split along the (1-100) plane being its cleavage plane, such a plurality of (1-100) planes form a stepped fissured surface. Therefore, the second method of fabricating the reflector surfaces in accordance with the growth on the sapphire A-plane is also disadvantageous in that the quality of the fissured surface of the GaN does not become very good.

With the method 3), the SiC substrate is very expensive, and this leads to the problem of a heavy burden in making various studies on growth conditions etc. Besides, in polishing the back surface before the cleaving step, conspicuous difficulty is involved because the hardness of SiC is very high. Further, the nitride layers which are formed on the SiC substrate are prone to crack in relation to the difference of thermal expansion coefficients, and this leads to a limitation on the design of the thickness of the nitride layers.

The method 4) is ideal concerning the cleaved state as explained before. However, it is difficult to form the thick GaN layer by vapor growth, and the step of polishing away the sapphire is very troublesome. Therefore, it has not been attained yet to obtain crystal substrates of large diameter with a sufficient yield.

OBJECT AND SUMMARY OF THE INVENTION

Therefore, the object of the present invention is to provide a reproducible method of manufacturing a group III nitride semiconductor laser having high quality reflector surfaces.

A fabrication method according to the present invention is a method for producing a nitride semiconductor laser which is obtained by successively stacking a plurality of crystal layers made of group III nitride semiconductors, including an active layer, on an underlayer made of a group III nitride semiconductor, is characterized by comprising:

the crystal layer formation step of forming the plurality of crystal layers on the underlayer formed on a substrate;

the electrode layer formation step of forming an electrode layer on an outermost surface of said crystal layers;

the plating step of plating a metal film onto the electrode layer;

the light irradiation step of irradiating an interface between the substrate and said underlayer with light through the substrate to form a region of decomposed substance of the nitride semiconductor;

the delaminating step of detaching said underlayer that supports said crystal layers from said substrates along the decomposed substance region; and the cleavage step of cleaving said underlayer with said crystal layers thereon to form cleaved mirrors of laser resonator.

In an aspect of the fabrication method according to the invention, said plating step includes a step of forming insulating stripes which extend parallel to an extending direction of the cleavage planes to be formed in said nitride semiconductors, on said electrode layer before the plating.

In another aspect of the fabrication method according to the invention, the scribing lines are formed on crystal layers parallel to the insulating stripes, whereupon said underlayer with said crystal layers thereon is cleaved at said cleavage step.

As to a further aspect of the fabrication method according to the invention, the metal film is made of copper.

As to a still further aspect of the fabrication method according to the invention, in said light irradiation step, light to be used (applied) is selected from a group of light having a wavelength which passes through said substrate and which is absorbed by a part of said underlayer vicinal to the interface.

In another aspect of the fabrication method according to the invention, at said light irradiation step, the irradiation is performed uniformly over the interface between the substrate and the underlayer, or by scanning the interface with a spot or with a line of light.

In a further aspect of the fabrication method according to the invention, said crystal layer formation step includes the step of forming waveguides which extend perpendicular to the cleaved planes to be formed in said nitride semiconductors.

As to a still further aspect of the fabrication method according to the invention, said crystal layers are formed by metal organic chemical vapor deposition.

As to another aspect of the fabrication method according to the invention, in the light irradiation step the light beam toward the interface, the light beam applied is an ultraviolet ray generated from a frequency quadrupled YAG laser.

A nitride semiconductor laser according to the invention having a plurality of crystal layers made of group III nitride semiconductors including an active layer comprises:

an underlayer made of a group III nitride semiconductor on which the crystal layers are successively stacked; and a plating metal film plated on an opposite side to the underlayer with respect to said crystal layers.

As to one aspect of the nitride semiconductor laser according to the invention, the plated metal film has suture planes each substantially coinciding with a cleavage plane of the stacked crystal layers of nitride semiconductors to constitute a laser resonator.

As to another aspect of the invention, the nitride semiconductor laser further comprises a waveguide which extends perpendicular to the cleavage plane.

As to a further aspect of the nitride semiconductor laser according to the invention, the plated metal film is made of copper.

As to a still further aspect of the invention, the nitride semiconductor laser further comprises a heat sink onto which a side of the underlayer is bonded.

As to another aspect of the invention, the nitride semiconductor laser further comprises a heat sink onto which a side of plated metal film is bonded.

A method for separating a substrate from a nitride semiconductor wafer, according to the invention, which is obtained by successively stacking at least one crystal layer made of group III nitride semiconductor on the substrate, comprises the steps of:

forming an auxiliary substrate on an outermost surface of the crystal layer;

irradiating an interface between the substrate and the crystal layer with light through the substrate to form a region of decomposed substances of the nitride semiconductor; and detaching said crystal layer away from said substrate along the decomposed substance region.

As to one aspect of the separation method according to the invention, the step of forming an auxiliary substrate includes a step of plating a metal film as the auxiliary substrate onto the outermost surface of the crystal.

As to another aspect of the separation method according to the invention, the step of plating includes a step of forming an electrode layer on the outermost surface of said crystal layer before plating;.

As to a further aspect of the separation method according to the invention, the metal film is made of copper.

As to a still further aspect of the separation method according to the invention, in said light irradiation step, light to be used(applied) is selected from a group of light having a wavelength which passes through said substrate and which is absorbed by a part of said crystal layer vicinal to the interface.

As to another aspect of the separation method according to the invention, at said light irradiation step, the irradiation is performed uniformly over the interface between the substrate and the crystal layer, or by scanning the interface with a spot or with a line of light.

As to a further aspect of the separation method according to the invention, in said light irradiation step, light to be applied is an ultraviolet ray generated from a frequency quadrupled YAG laser.

According to the present invention, the decomposition region in which the crystal coupling between the sapphire substrate and the GaN crystal is entirely or locally released is formed, whereby the sapphire substrate can be removed away from the GaN crystal underlayer while holding the fabricated structure by the GaN crystal side, so that the nitride semiconductor laser can be reliably obtained.

Since, at the cleavage step, a crystal part to be parted is substantially made of only GaN-based materials, a cleaving property can be improved to obtain a stable reflector surface of good quality. In order to keep the strength of the GaN-based crystal portion, the metal film which acts as an auxiliary substrate is formed on the laser structure. The auxiliary substrate is formed by a plating method in which the electrode of the laser structure under fabrication is employed as an underlying electrode and is overlaid with a metal material by electrodeposition. The plating method includes elecroless plating in addition to electroplating.

Further, at the plating step, insulating stripes each of which is a long and narrow pattern made of an insulating material are formed on the parts of the underlying electrode corresponding to lines along which the GaN-based crystals are to be cleaved. Owing to the formation of the insulating stripes, the strength of the cleavage line parts of the auxiliary substrate can be locally lowered along the cleavage line.

After the deposition of the metal film, namely, the formation of the auxiliary substrate, the output of a high-power ultraviolet laser is applied from the back side of the sapphire substrate, thereby separating the sapphire substrate from the GaN-based crystal layers. An electrode is formed on a surface exposed by the removal of the sapphire substrate. Thereafter, the metal film is divided along the above insulating stripes, and the GaN-based crystals are simultaneously cleaved, whereby laser bars are obtained.

DETAILED DESCRIPTION OF THE PREFERRED EMBODIMENTS

Now, an example of the aspect of performance of the present invention will be described about a group III nitride semiconductor laser in an embodiment of the present invention with reference to the drawings.

<Formation of Plurality of Crystal layers made of Group III Nitride Semiconductors, including Active Layer>

Figure 1:
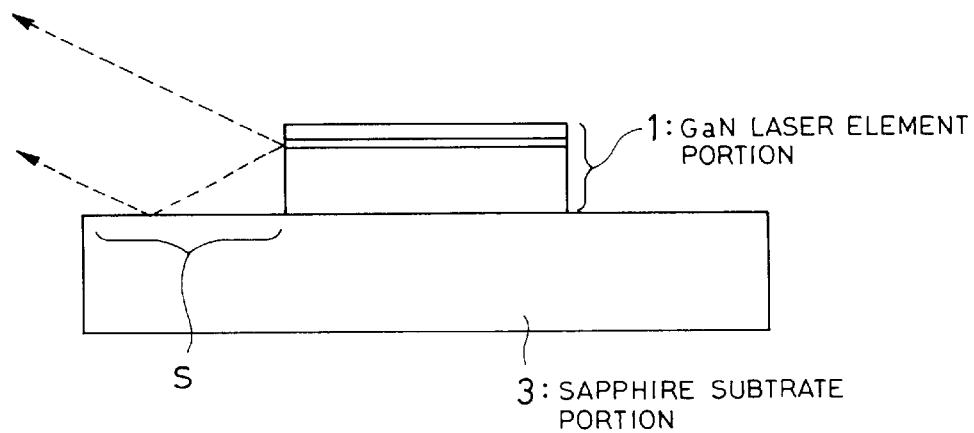
FIG. 1 is a schematic sectional view of a semiconductor laser formed on a sapphire substrate.
Figure 2:
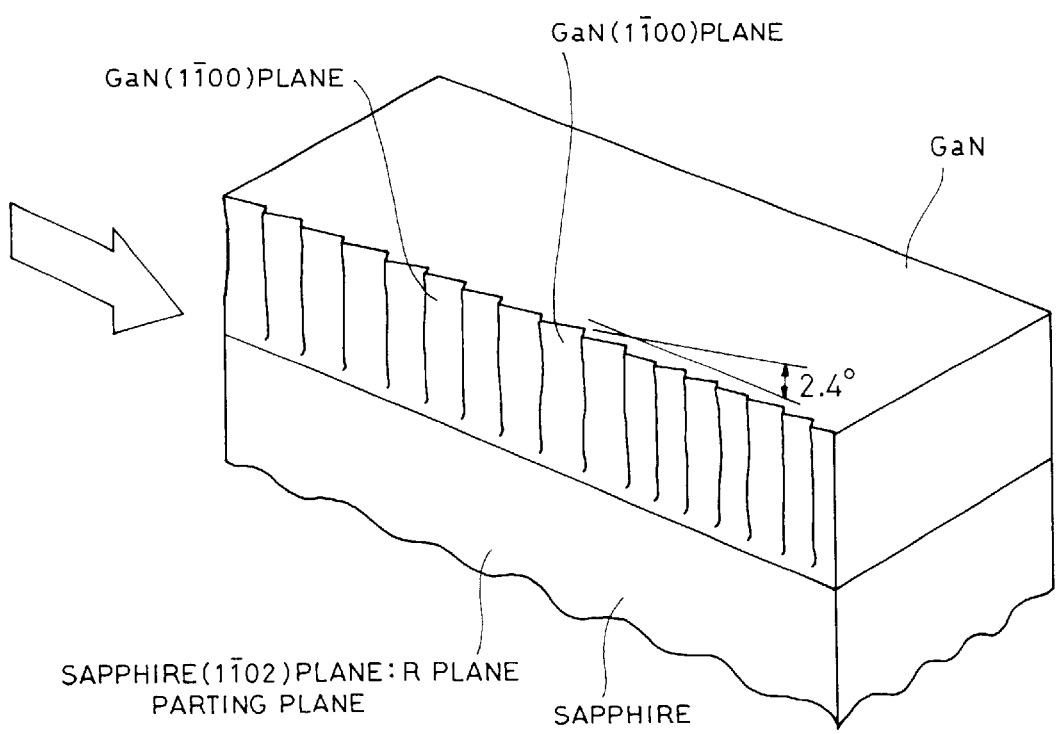
FIG. 2 is a schematic perspective view showing the ruptured surface of a GaN crystal layer formed on a sapphire substrate.
Figure 3:
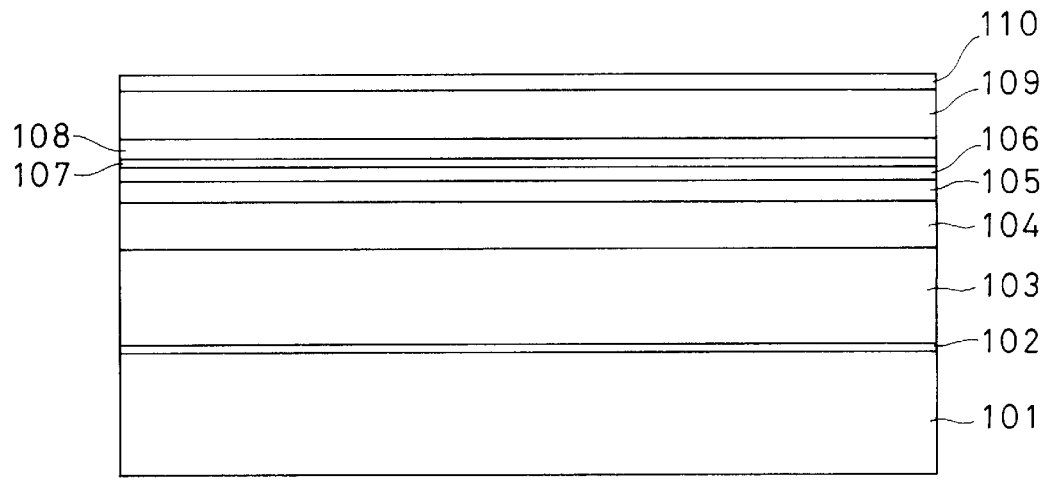
FIGS. 3 and 4 are schematic sectional views each showing a portion of a wafer for the semiconductor laser device at each fabricating step of an embodiment of the present invention.

A group III nitride semiconductor laser device structure, that is, a layer structure for a laser device as shown in FIG. 3 is fabricated on a sapphire A-plane substrate both surfaces of which have been mirror-polished, in accordance with metal organic chemical vapor deposition (MOCVD) and by a fabricating process as explained below.

First, a single-crystal sapphire substrate 101 is put in an MOCVD growth reactor for film formation, and it is held at a temperature of 1050° C. in a hydrogen gas flow under a pressure of 300 Torr for 10 minutes, to thermally clean the surfaces of the sapphire substrate 101. Thereafter, the temperature of the sapphire substrate 101 is lowered to 600° C., whereupon ammonia ($NH_3$) being the precursor of nitrogen and trimethylaluminum (TMA) being the precursor of Al are introduced into the growth reactor. Thus, a buffer layer 102 made of AlN is deposited to a thickness of 20 nm.

Subsequently, while only the $NH_3$ is kept flowing with the TMA flow cut off, the temperature of the sapphire substrate 101 with the buffer layer 102 is raised to 1050° C. again, and trimethylgallium (TMG) is introduced to grow an n-type GaN underlayer 103. On this occasion, methyl silane (Me-$SiH_3$) is added into the growth atmosphere as the precursor of Si being an n-type impurity.

When the n-type GaN underlayer 103 has been grown to about 4 μm, only the supply of TMG is stopped. On the other hand, Me-$SiH_3$ is kept supplied with increased flow rate. After this state has been held for 5 minutes, the flow rate of Me-$SiH_3$ is decreased down to a quantity necessary as an n-type layer, while TMG is introduced again, and TMA is simultaneously introduced. Thus, an n-type AlGaN cladding layer 104 is formed. When the n-type AlGaN cladding layer 104 has been grown to about 0.5 μm, the supply of TMA is stopped, and an n-type GaN guide layer 105 is grown to 0.1 μm. When the growth of the n-type GaN guide layer 105 has been completed, the temperature is started lowering with the TMG flow and the Me-$SiH_3$ flow cut off, until the substrate temperature reaches 750° C.

When the substrate temperature has reached 750° C., the carrier gas is changed from hydrogen to nitrogen. When the nitrogen gas flow has been stabilized, TMG, trimethylindium (TMI) and Me-$SiH_3$ are introduced so as to grow a barrier layer.

Subsequently, the flow rate of TMI is increased with the Me-$SiH_3$ flow cut off, to grow a well layer which has an indium (In) content higher than that of the barrier layer. The growths of the barrier layer and the well layer are iterated in conformity with the designed number of iterations of a multiple quantum well (MQW). Thus, an active layer 106 having a MQW structure is grown.

When the active layer 106 has been formed by overlaying the last well layer with the barrier layer, the supplies of TMG, TMI and Me-$SiH_3$ are stopped, and the carrier gas is changed from the nitrogen to hydrogen. When the hydrogen gas flow has been stabilized, the temperature is raised to 1050° C. again while $NH_3$ is kept flowing. Then, TMG, TMA and ethyl-cyclopentadienyl magnesium (Et-Cp2Mg), which is a precursor of Mg being a p-type impurity, are introduced to stack a p-type AlGaN layer 107 having a thickness of 0.01 μm. Subsequently, a p-type GaN guide layer 108 is grown 0.1 μm by stopping the supply of TMA, and a p-type AlGaN cladding layer 109 is grown to 0.5 μm by introducing TMA again. Further, a p-type GaN contact layer 110 is grown on the resultant structure to a thickness of 0.1 μm. Thereafter, the temperature of the resulting substrate is started lowering with supply of TMG and ET-Cp2 Mg cut off. When the substrate temperature has reached 400° C., the supply of $NH_3$ is also stopped, and when the substrate temperature has reached a room temperature, the resulting wafer is taken out of the reactor.

<Step for Activating p-type Dopants>

The wafer with grown layers is set in a heat treatment furnace, and a process of activating p-type dopants is carried out at a treating temperature of 800° C. in a nitrogen atmosphere of atmospheric pressure for a time period of 20 minutes.

In this way, the wafer shown in FIG. 3 is produced.

<Fabrication of Ridge Waveguides>

Ridge waveguides are formed on a surface the obtained wafer to serve as refractive index guiding structures also for current confinement.

Figure 4:
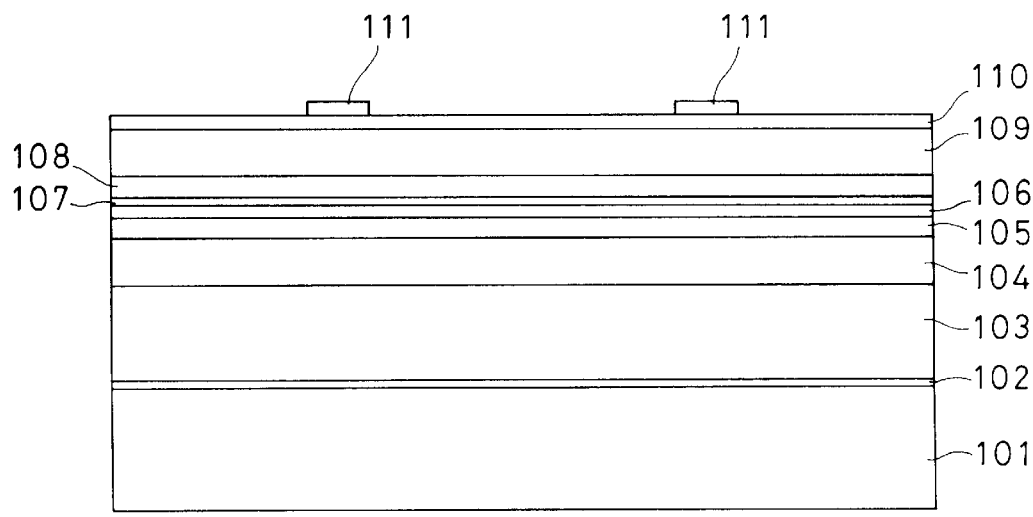
Figure 5:
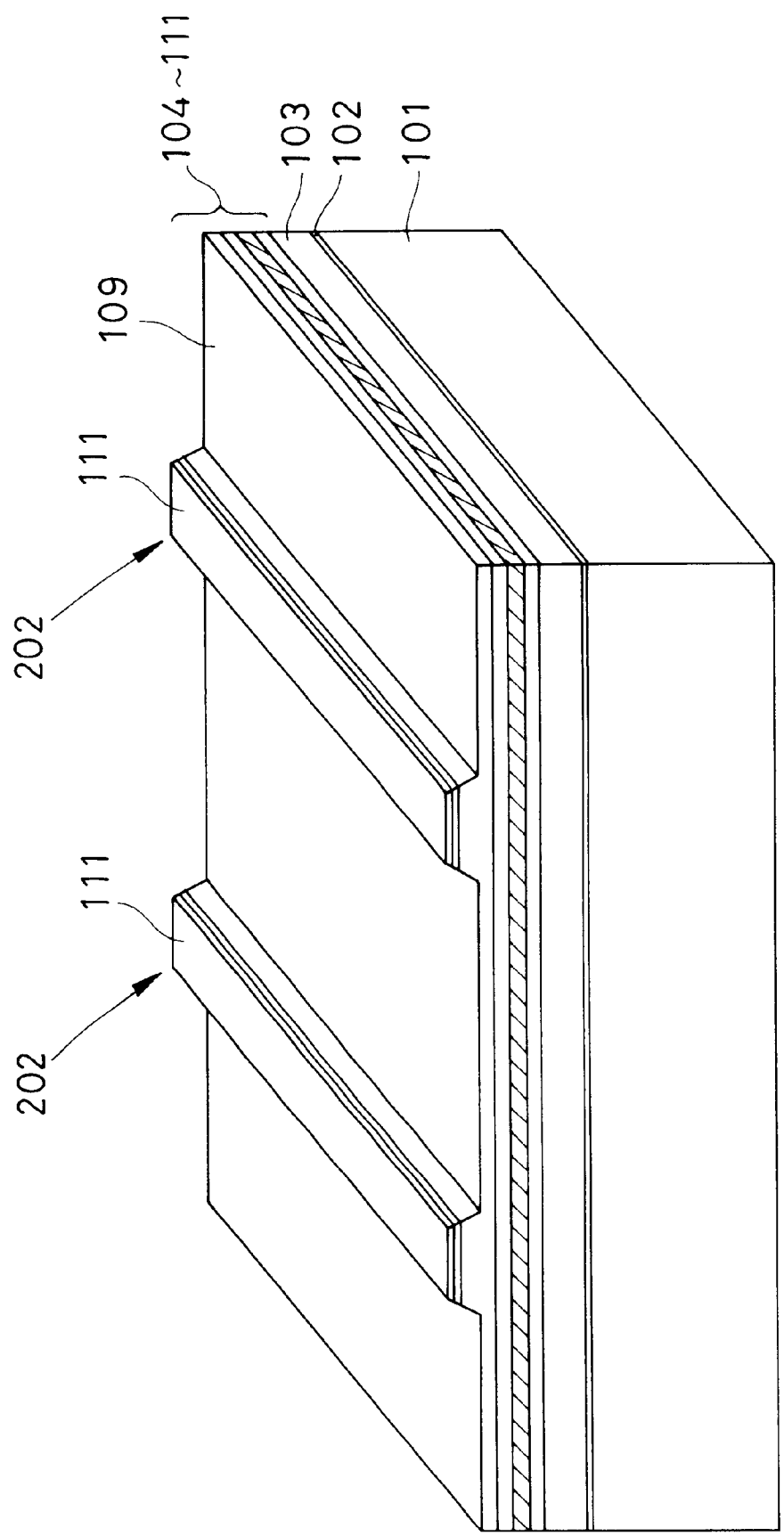
FIGS. 5 through 9 are schematic perspective views each showing the states of a wafer for the semiconductor laser device in the manufacturing process of a semiconductor laser in an embodiment of the present invention.

After the p-type activation process, the wafer is put in an evaporation apparatus, and a nickel (Ni) film 111 (p-electrode) is formed on the p-type GaN contact layer 110 to a thickness of about 0.2 μm. Using conventional photolithography, the Ni film 111 is etched to leave 5 μm wide stripes as shown in FIG. 4. Subsequently, reactive ion etching (RIE) is performed using the Ni stripes 111 as a mask, so as to etch the p-type GaN contact layer 110 and the p-type AlGaN cladding layer 109. More specifically, the parts of the contact layer 110 outside the Ni stripes 111 being 5 μm wide are fully removed, and the corresponding parts of the cladding layer 109 are thinned to a thickness of about 0.1 μm. Thus, narrow ridge portions 202 are formed as shown in FIG. 5.

Figure 6:
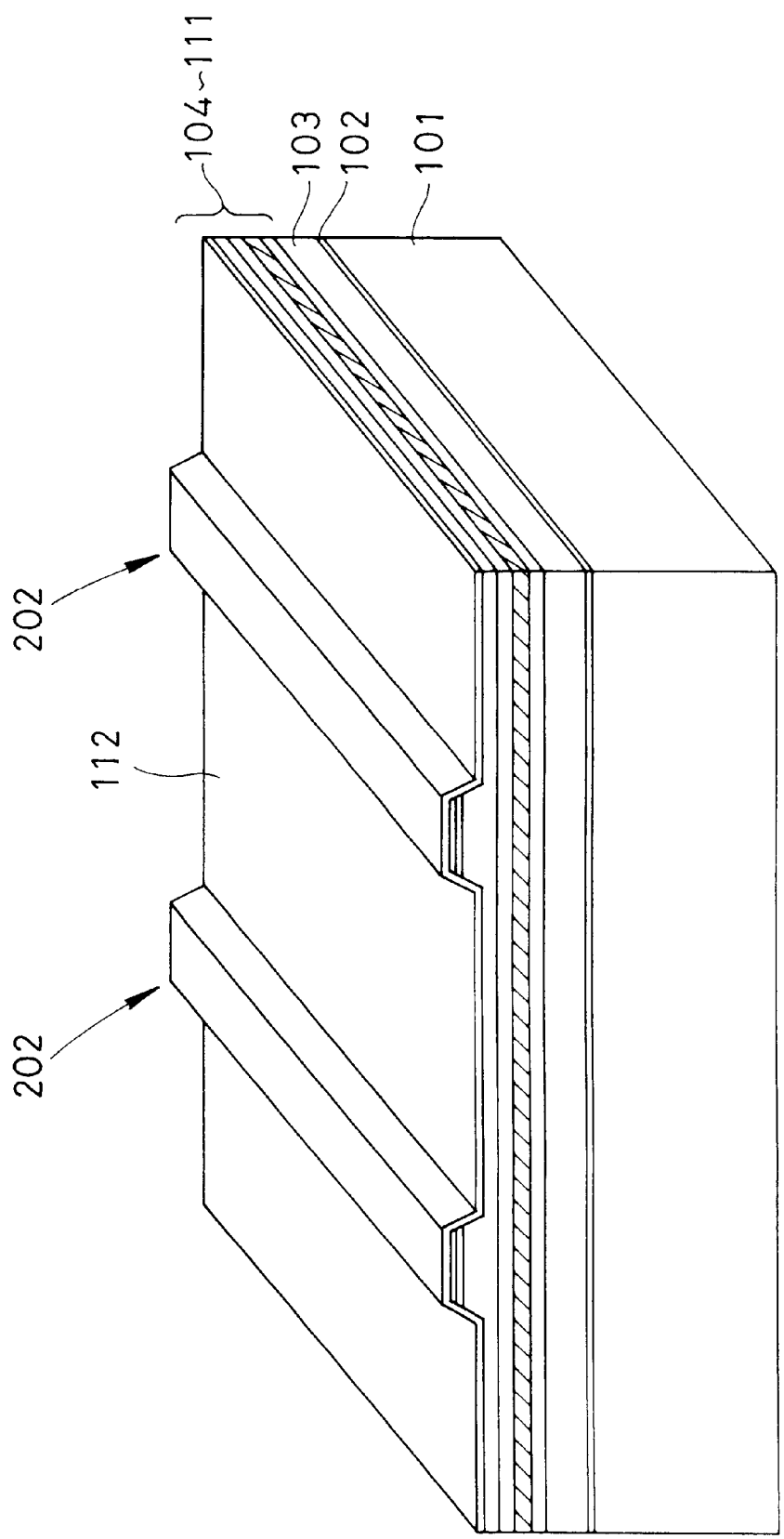
Figure 7:
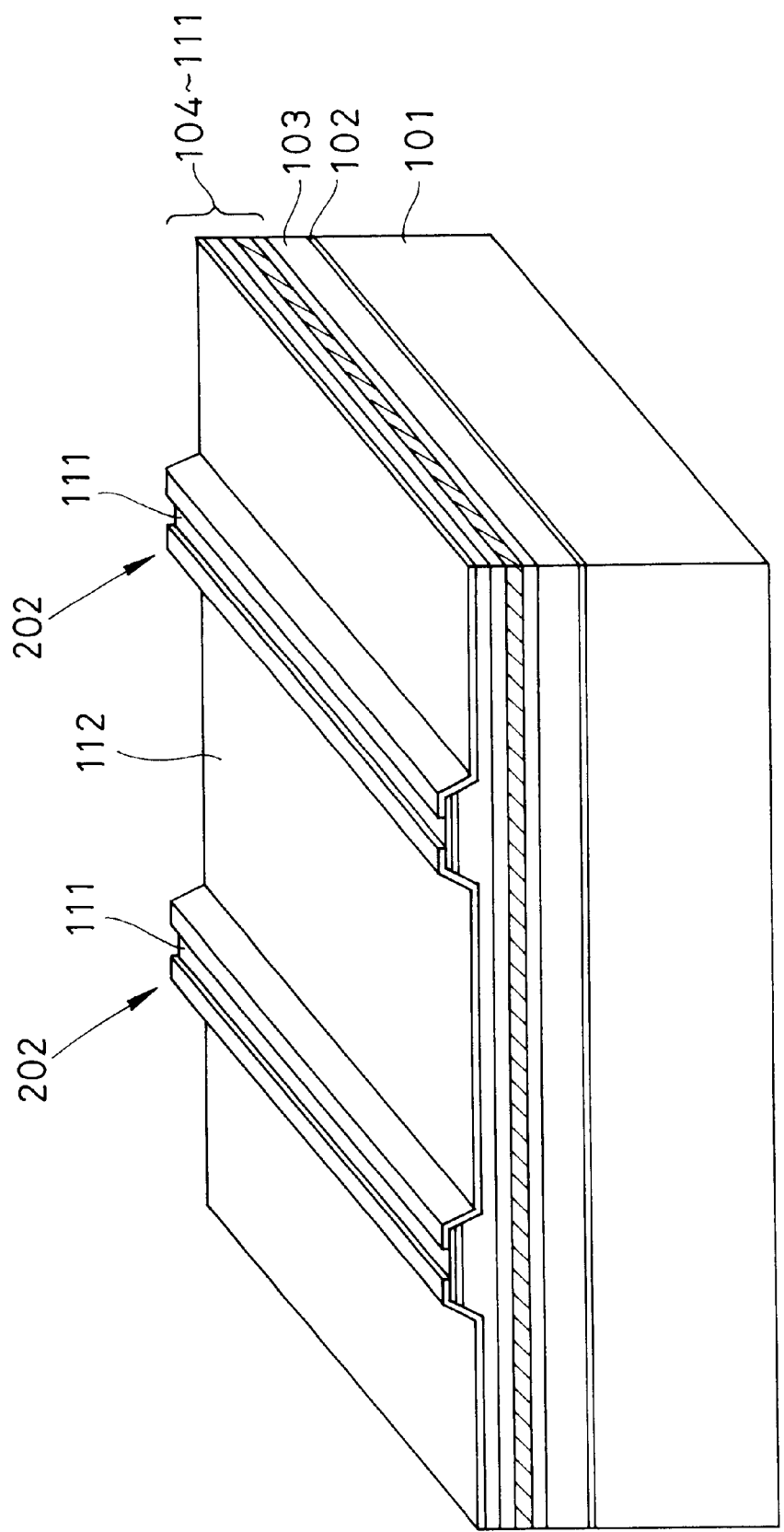

As shown in FIG. 6, an $SiO_2$ protective film 112 is deposited on the ridge portions 202 and p-type AlGaN cladding layer 109 of the resulting wafer by sputtering or the like. Thereafter, as shown in FIG. 7, the parts of the protective film 112 corresponding to the top surfaces of the respective p-type ridge portions 202 are etched by conventional photolithography so as to expose those parts of the Ni stripes 111 which are 3 μm wide, in the extending directions of the ridge portions 202. Thus, windows 113a for an electrode are formed.

<Electrode Layer Formation Step>

Figure 8:
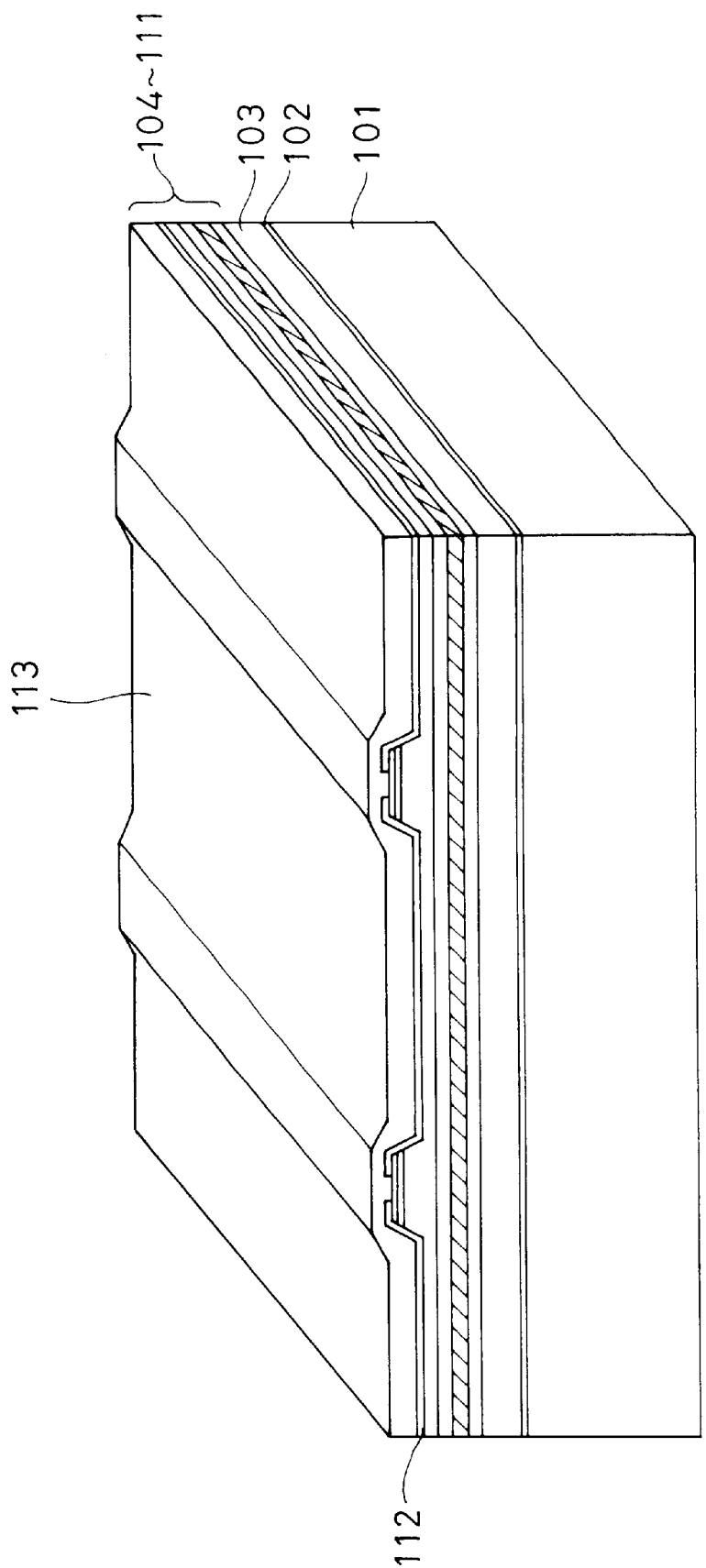

On the whole surface of the resulting wafer including the windows 113a where the Ni film 111 is exposed, titanium (Ti) and gold (Au) are successively evaporated with thicknesses of 0.05 μm and 0.2 μm, respectively. Thus, the p-side electrode 113 is formed. In this way, device structure as shown in FIG. 8 is formed in each individual device section of the wafer.

<Plating Step>

Figure 9:
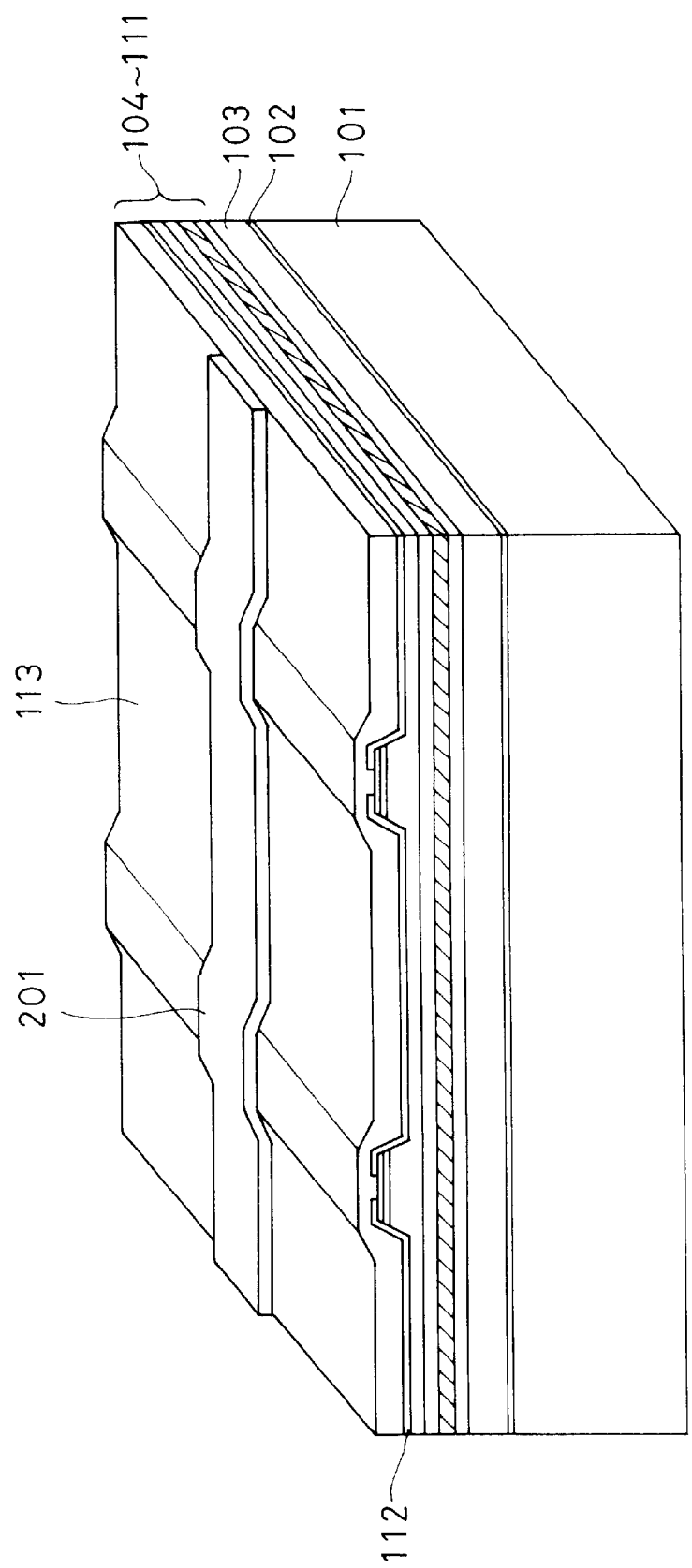

A plurality of insulating stripes 201, each of which is a long and narrow pattern made of an insulating material, for example, $SiO_2$ and being about 5–20 μm as shown in FIG. 9, are formed on the Au surface of the p-side electrode 113 of the wafer thus fabricated. On this occasion, each of the insulating stripes 201 is formed so that the extending direction thereof may become perpendicular to the ridge portions 202 of the laser device, namely, parallel to cleavage planes along which wafer planes are to be cleaved later.

Figure 10:
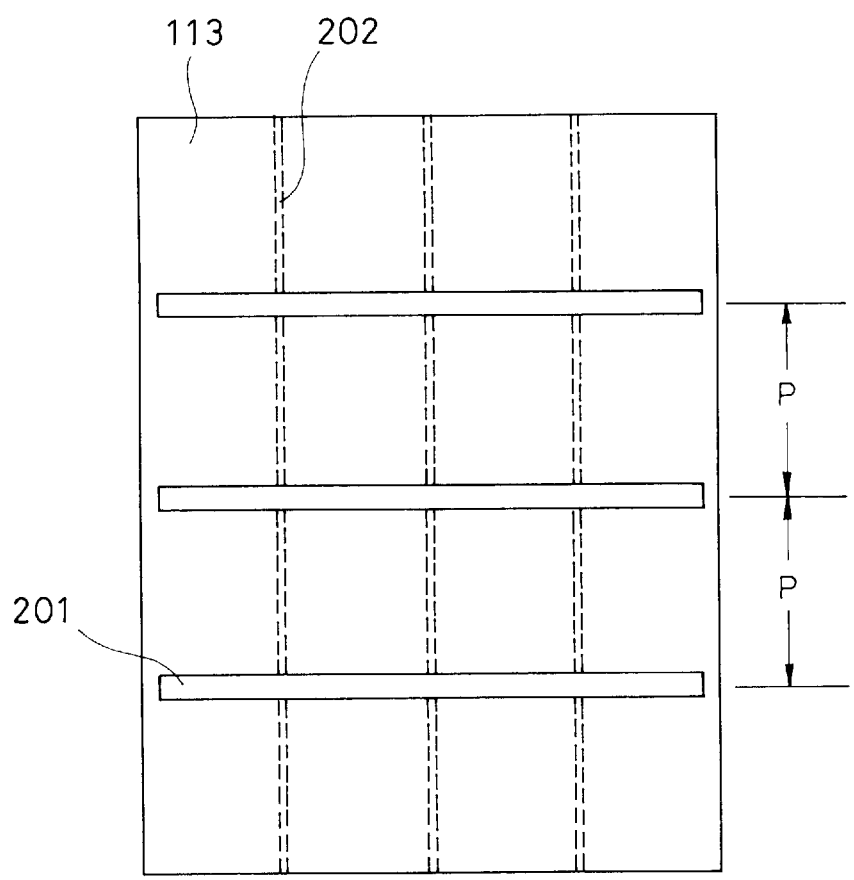
FIG. 10 is a schematic plan view showing the surface of a wafer for the semiconductor laser device in the fabricating step of an embodiment of the present invention.

FIG. 10 shows a plan view of the wafer on which the insulating stripes 201 have been formed on the Au surface of the p-side electrode 113. The pitch P of the insulating stripes 201 is set at the same dimension as the cavity length of the laser device which is to be finally fabricated.

Figure 11:
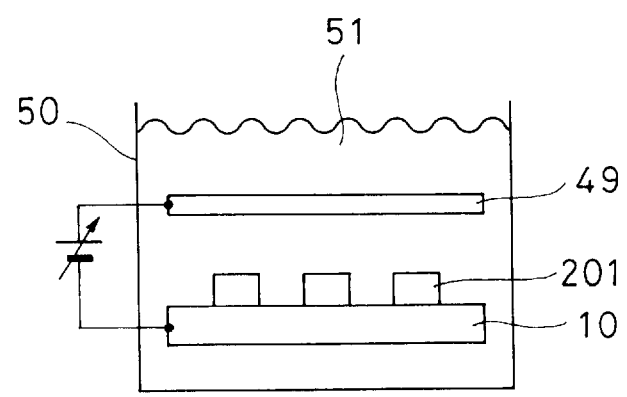
FIG. 11 is a schematic sectional view showing an electric plating bath in which a wafer for the semiconductor laser device is dipped in the fabricating step of an embodiment of the present invention.

Subsequently, the electroplating of copper (Cu) is performed on the Au surface of the p-side electrode 113. Parts where the Cu plating is unnecessary, are provided with protective films beforehand. As shown in FIG. 11, a plating bath 50 with an anode 49, which is filled with a solution 51 containing Cu ions, is prepared, the wafer 10 obtained is immersed in the bath 50, and direct current is caused to flow for a predetermined time period between the anode 49 and a cathode which is the Au surface of the p-side electrode 113 of the wafer 10, whereby Cu is deposited by the electroplating. The thickness of deposited Cu films 120, which serve as an auxiliary substrate made of metal films, is set at about 50–100 μm. The material of an auxiliary substrate functioning till the cleaving step need not be Cu, but Cu is the most preferable among metals in consideration of thermal conduction in the case where the laser device is to be finally mounted on a heat sink.

In the electroplating, no current flows through the parts provided with the insulating stripes 201, and hence, no Cu precipitates at these parts. The precipitating Cu 120 initially assumes a sectional shape as shown by "a" in FIG. 12. As the plating proceeds, the Cu films 120 are deposited, not only in their thickness directions, but also in their lateral directions, as shown by "b" in FIG. 12. When the plating is further continued, the Cu films 120 precipitating on both the sides of the insulating stripes 201 come into touch with each other as shown by "c" in FIG. 12. Thenceforth, the Cu films 120 are deposited in a substantially two-dimensional situation. In the case of the insulating stripes 201 with a wide about 10 $\mu$m as in this embodiment, a substantially flat surface is obtained when each of the Cu films 120 is formed at the sufficient thickness (50–100 $\mu$m).

Figure 12:
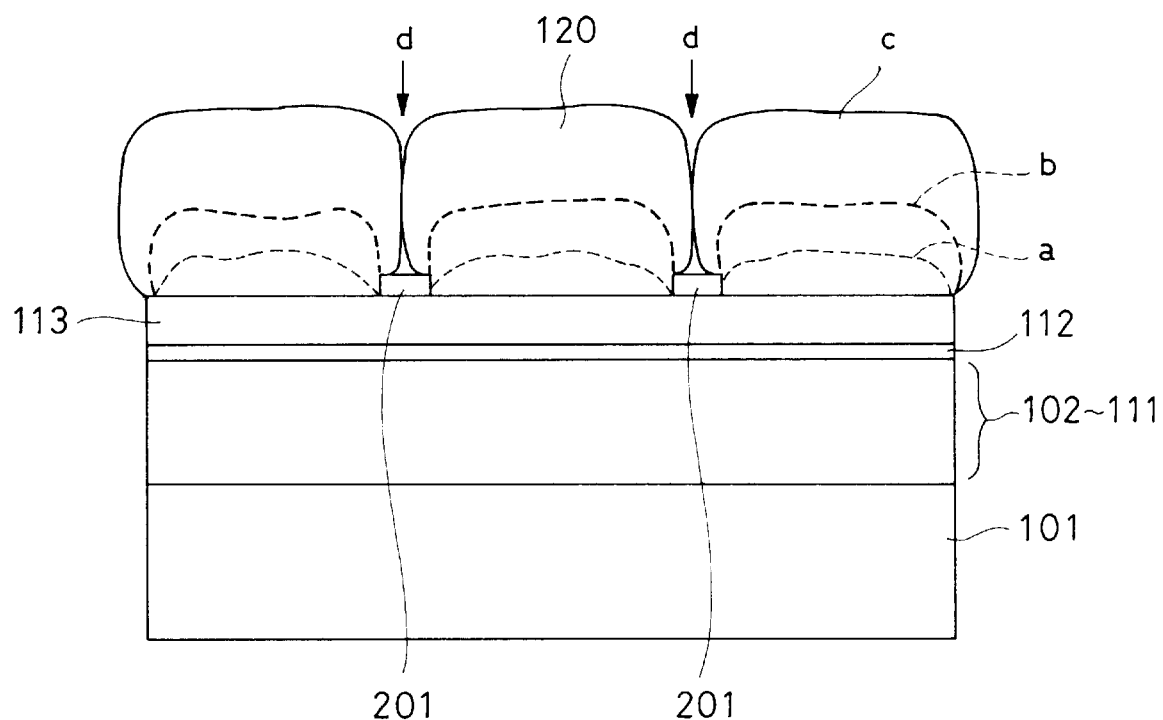
FIGS. 12 and 14 are partially enlarged schematic sectional views each showing a wafer for the semiconductor laser device in the fabricating step of an embodiment of the present invention.

Since coalescence regions shown by "d" in FIG. 12 are formed merely by touching of the Cu films 120 grown separately from one another, they are not perfectly joined as a crystal. Besides, when the pattern width of the insulating stripes 201 is set broad, the Cu films 120 unite late, and hence, the strength of the Cu lowers greatly at the uniting parts, so that the cleavage is facilitated.

Figure 13:
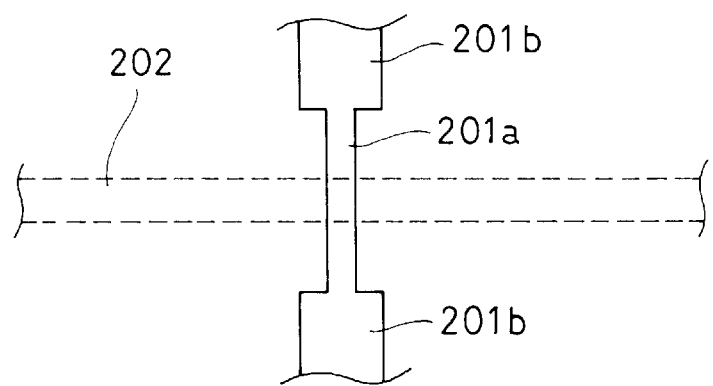
FIG. 13 is a partially enlarged schematic plan view showing the surface of a wafer for the semiconductor laser device in the fabricating step of an embodiment of the present invention.
Figure 14:
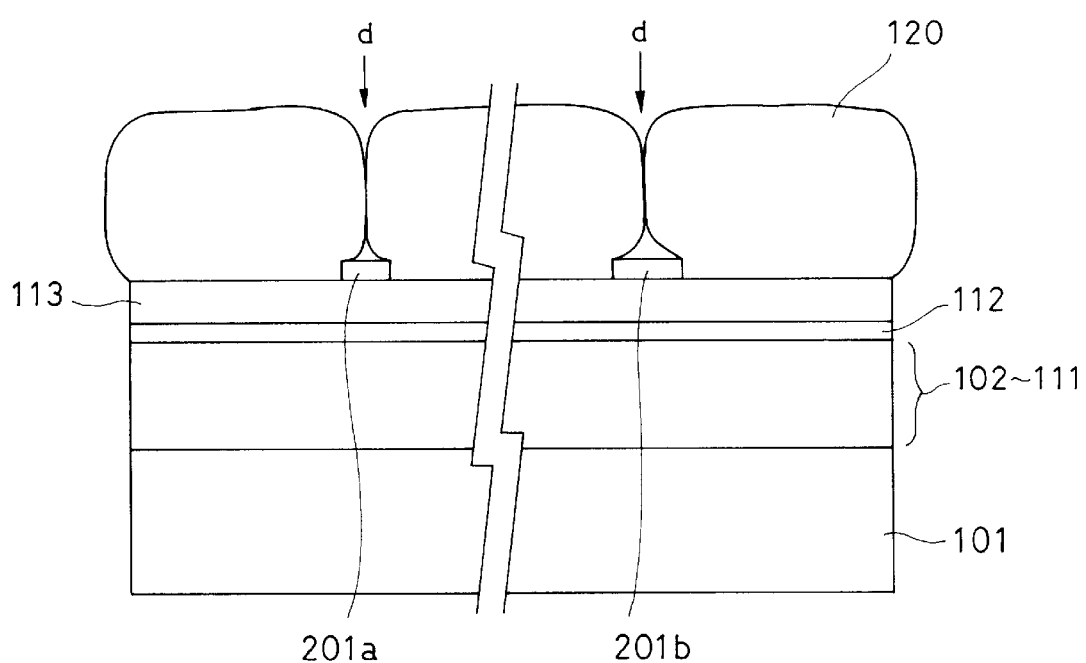

In forming the above insulating stripes 201, the width of a stripe pattern can be made smaller at a part 201-$a$ near the ridge portion 202, than the other part 201-$b$, as shown in FIG. 13. Thus, at the plating step, the uniting of the Cu films 120 can be delayed only at and near the broader part 201-$b$ as shown in FIG. 14.

Figure 15:
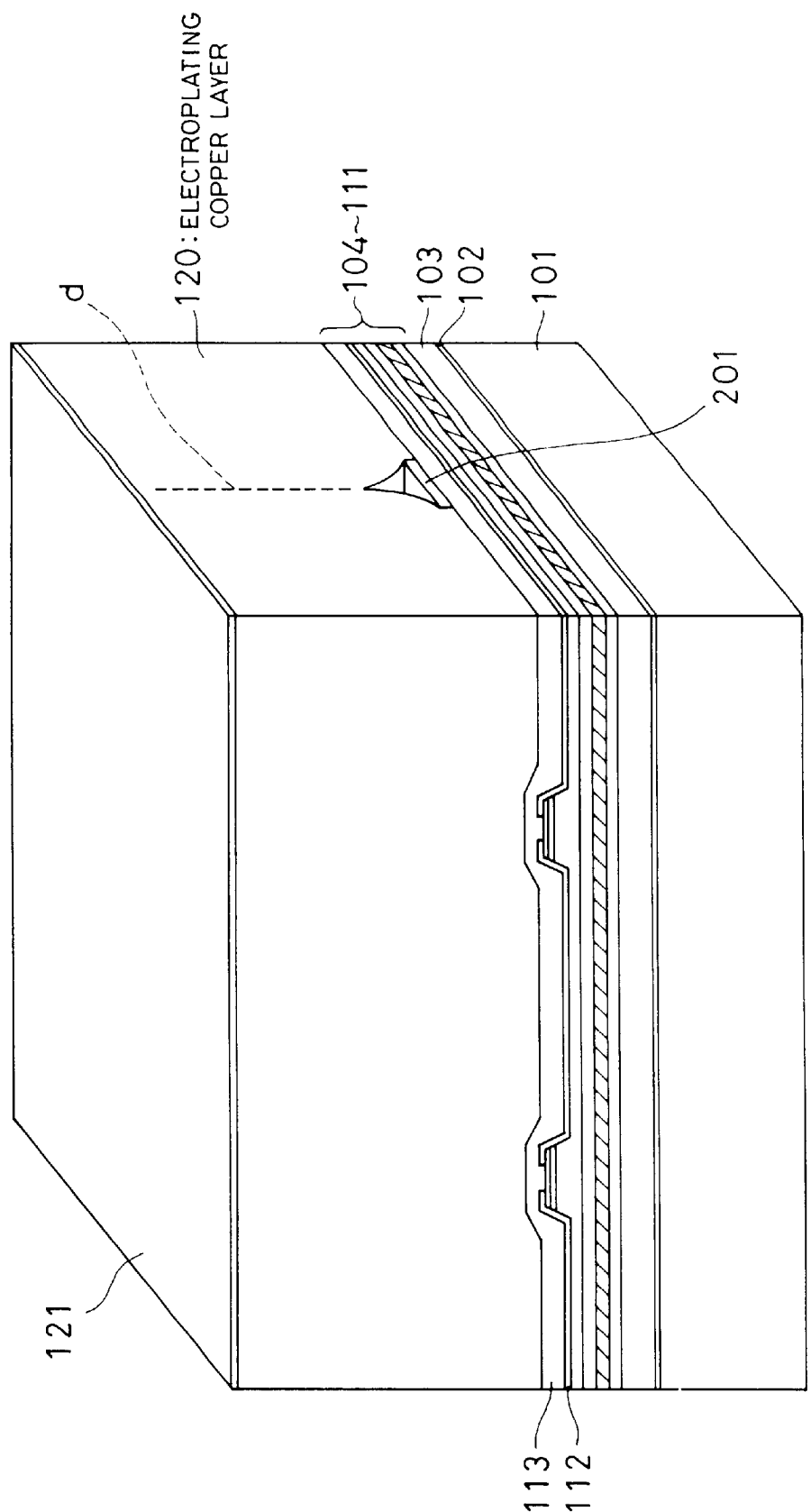
FIGS. 15 to 18 are perspective views each showing a wafer for the semiconductor laser device in the fabricating step of an embodiment of the present invention.

After the completion of the plating step, the wafer is washed as predetermined, and an Au base thin film 121 is formed on the Cu films 120 by evaporation. In this way, the device structure as shown in FIG. 15 is formed in each individual device section of the wafer. The metallic Cu is comparatively liable to oxidize. Therefore, when the bonding property of the laser chip finally fabricated is considered, the surfaces of the Cu films 120 should desirably be protected. This is the reason why the Au film 121 is formed on the surfaces of the Cu films 120 by the evaporation or the like. In that case, a thin metal film of chromium (Cr), Ti or the like should more preferably be interposed between the Cu films 120 and the Au film 121 for the purpose of increasing a binding strength.

In this manner, at the plating step, the crystal orientation of the GaN-type crystal layers and the extending direction of the stripes are held in agreement in order to manifest the suture plane "d" substantially agreeing with those cleavage planes of the stacked crystal layers which are to be obtained at the later cleaving step and which are to constitute desired laser resonators.

<Bonding to Metal Films Formed by Plating>

Figure 16:
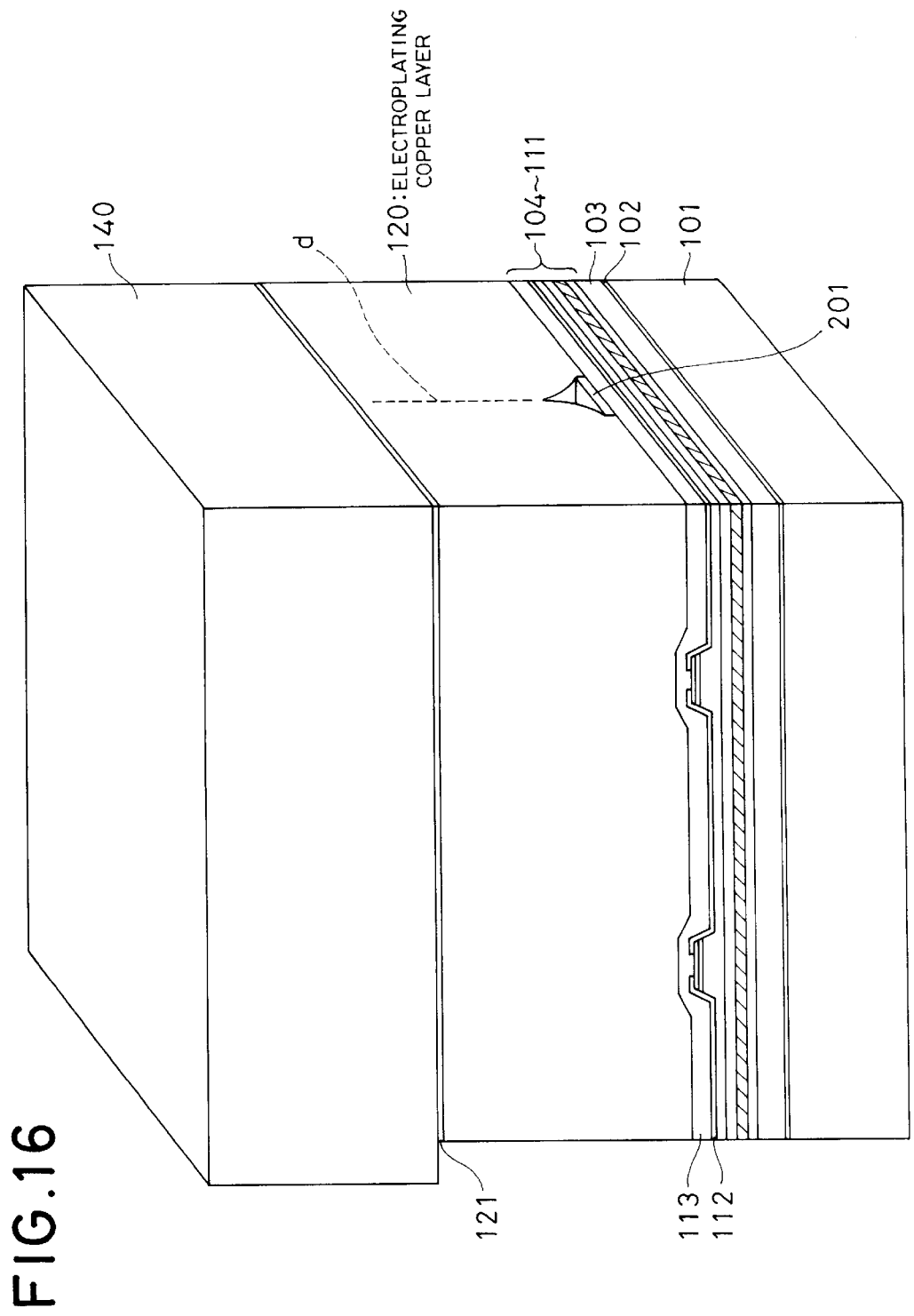

Subsequently, as shown in FIG. 16, a holding metal plate 140 having a thickness of about 0.1 mm is bonded with In or the like low-melting metal onto the Au base thin film 121 evaporated on the Cu films 120 which overlies the electrode 113 of the GaN type laser structure formed in the wafer.

<Irradiation of Wafer with Light from Sapphire Side>

Figure 17:
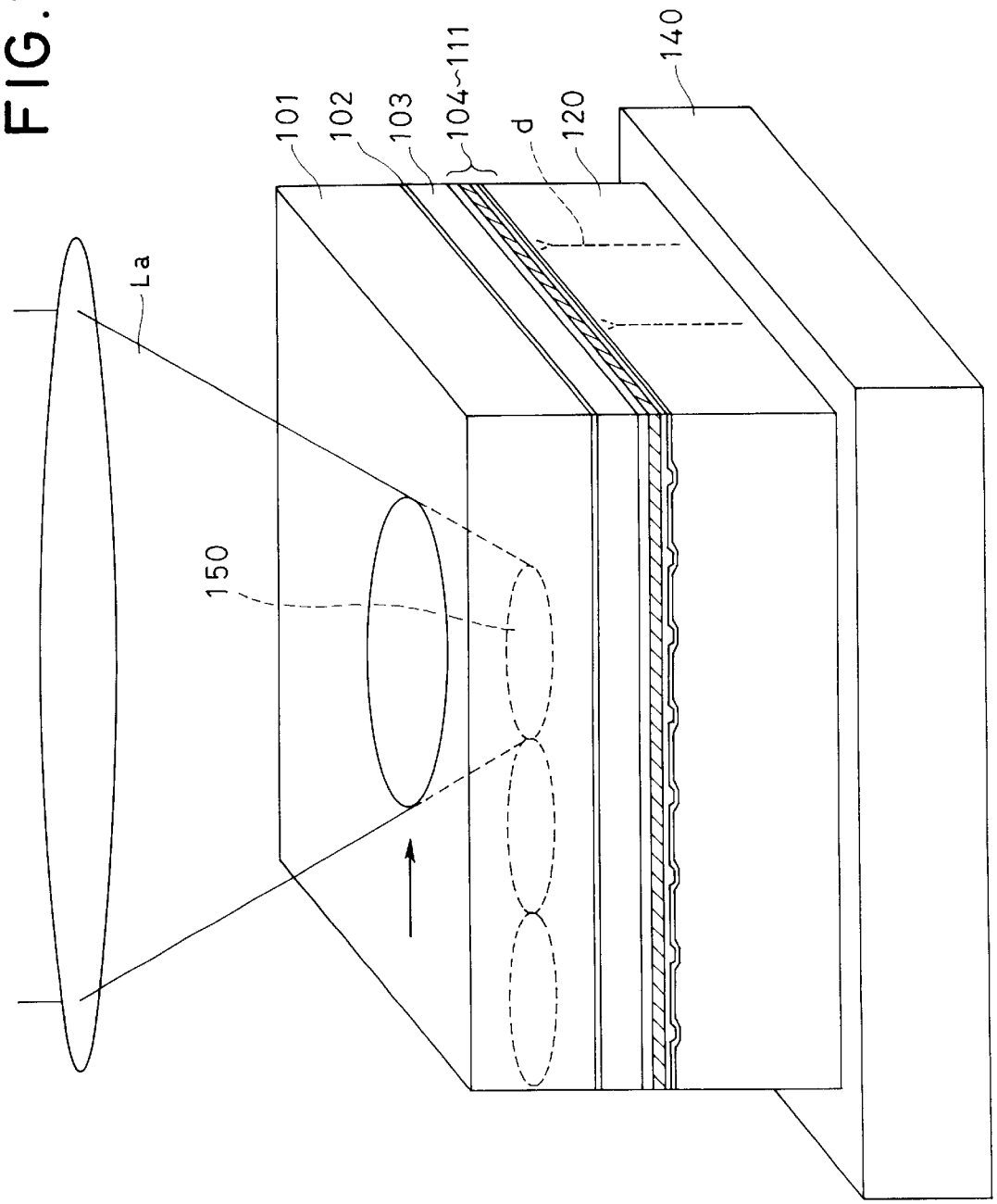

Subsequently, as shown in FIG. 17, a light beam La condensed by a condenser lens is applied from the back side of the sapphire substrate 101. Here, it is possible to employ the output light of a short-wavelength high-power laser of ultraviolet region, for example, an ultraviolet ray (wavelength: 266 nm) generated from a frequency quadrupled YAG laser, or the output light (wavelength: 248 nm) of a KrF excimer laser. Although the light beam La may be applied uniformly on the whole underlayer 103, it may well be applied so as to uniformly scan the underlayer 103 in the shape of a spot or a line at a predetermined pitch or at random.

At the wavelength of the laser light employed for the irradiation of the wafer, for example, 248 nm, the sapphire of the substrate 101 is almost transparent, whereas GaN absorbs the irradiation light at a slight penetration depth because its absorption edge is 365 nm. Besides, on account of a large lattice mismatch between the sapphire substrate 101 and the GaN, a very large density of crystal defects exist in the GaN vicinal to the interface between the substrate 101 and the GaN. Therefore, the energy of the absorbed light is converted into heat, and the GaN vicinal to the interface has its temperature raised suddenly to be decomposed into metal Ga and nitrogen. In consequence, the region 150 of the decomposed substances of the nitride semiconductor is formed at the interface between the sapphire substrate 101 and the underlayer 103.

The region 150 of the decomposed substances of the nitride semiconductor is provided in order to remove the sapphire substrate 101 used for the manufacture from the crystal of the underlayer 103, such as GaN or AlN. In other words, the wavelength of the laser light beam is selected from wavelengths which pass through the substrate for the crystal growth such as of sapphire and which are absorbed by the underlayer such as of GaN of the laser structure. The crystal coupling between the sapphire substrate 101 and the crystal of the underlayer 103 such as of GaN is destroyed by such a light beam. Therefore, the underlayer 103 becomes easy to be delaminated from the sapphire substrate 101 along the decomposed substance region 150.

<Separation between Sapphire and Laser Structure Portion>

Thereafter, the sapphire substrate 101 of the wafer is somewhat heated. Since the metal Ga produced by the decomposition may be fused, the temperature of the heating suffices with about 40° C.

Figure 18:
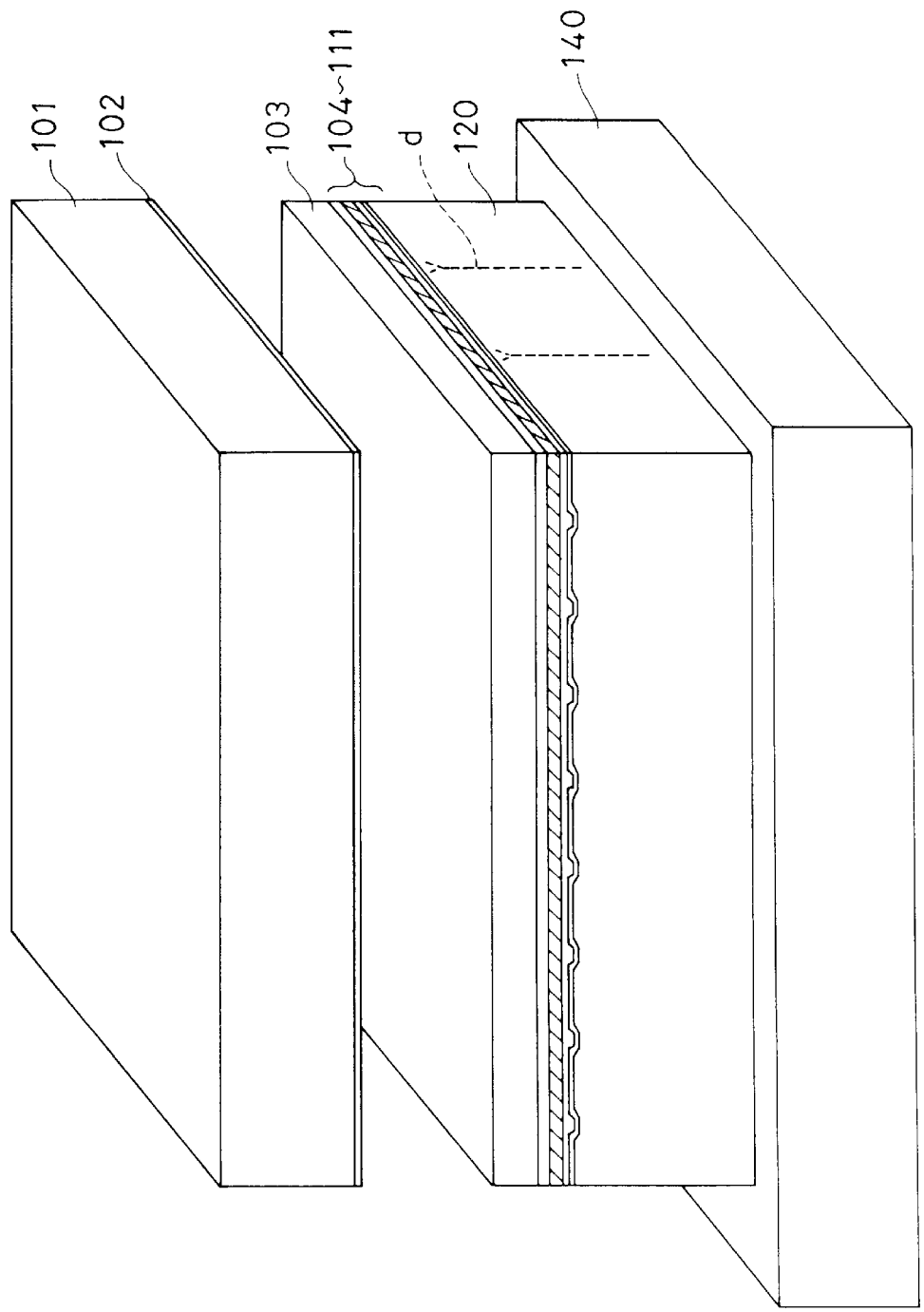

As shown in FIG. 18, therefore, the sapphire substrate 101 is separated from the unitary body consisting of the laser structure portion and the Cu films 120.

Although the GaN film 103, etc. of the laser structure portion have a total thickness on the order of several $\mu$m, they are lined with the thick Cu films 120 and do not become discrete. The GaN crystal portion which is as thin as several $\mu$m could be very easily damaged if separated from the sapphire substrate 101 without attaching anything thereto. The laser structure portion, however, is not easily damaged for the reason that it is plated with the Cu films 120 having the thickness on the order of several tens of microns, whereupon it is bonded to the holding metal plate 140.

After the sapphire substrate 101 has been removed, the laser structure portion and the Cu films 120 are immersed in a dilute acid in the state in which they are bonded to the holding metal plate 140, whereby residual metal Ga is eliminated.

Figure 19:
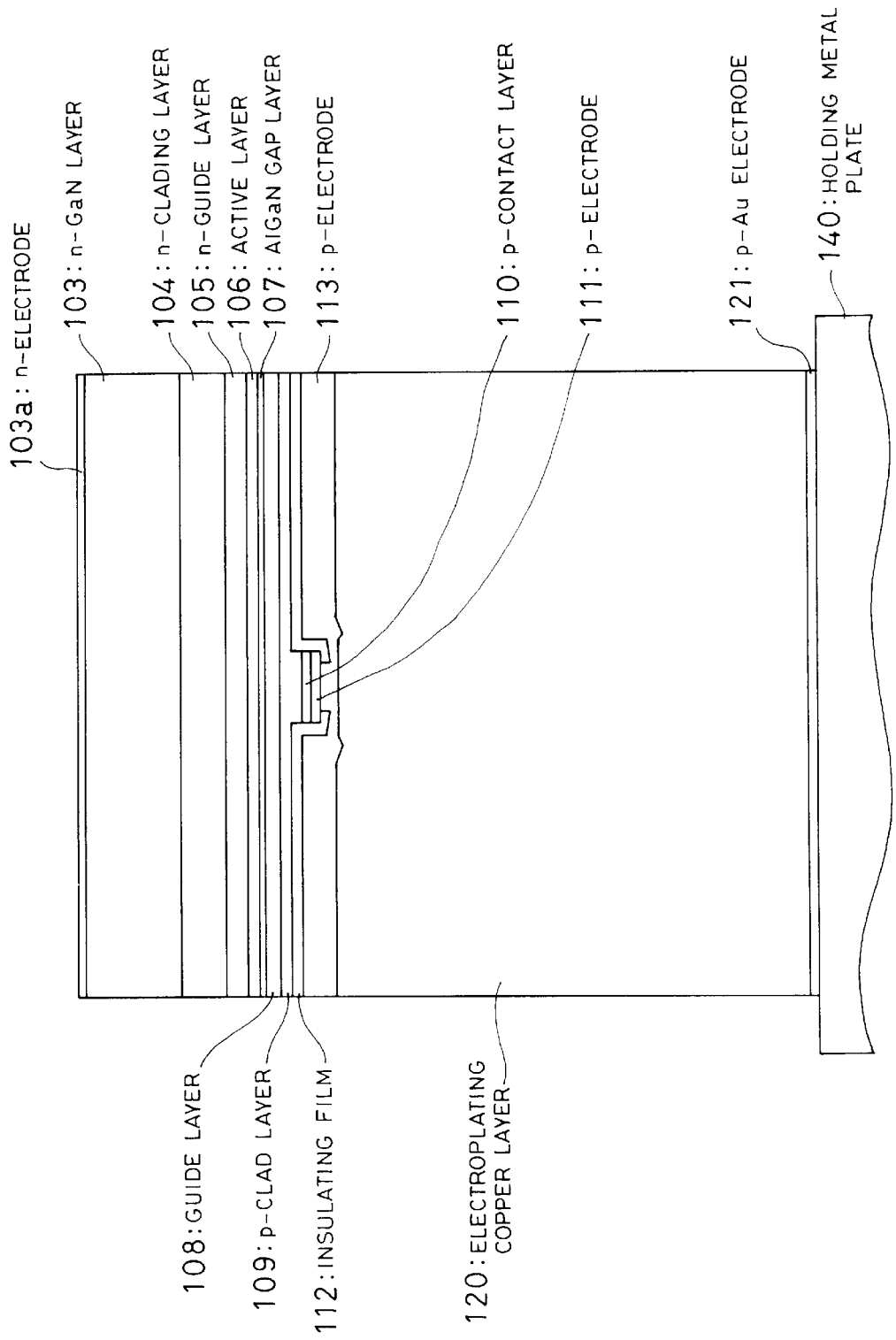
FIG. 19 is a schematic sectional view of a group III nitride-semiconductor laser device of an embodiment according to the present invention.

Thereafter, the wafer bearing the holding metal plate 140 is put in an evaporation apparatus. As shown in FIG. 19, the n-type GaN film 103 is exposed to that part of the wafer from which the sapphire substrate 101 has been removed, and titanium (Ti) and aluminum (Al) are successively evaporated in the evaporation apparatus to thicknesses of 0.05 $\mu$m and 0.2 $\mu$m on the n-type GaN film 103. Thus, an n-side electrode 103$a$ is formed.

<Cleavage of GaN Underlayer>

Figure 20:
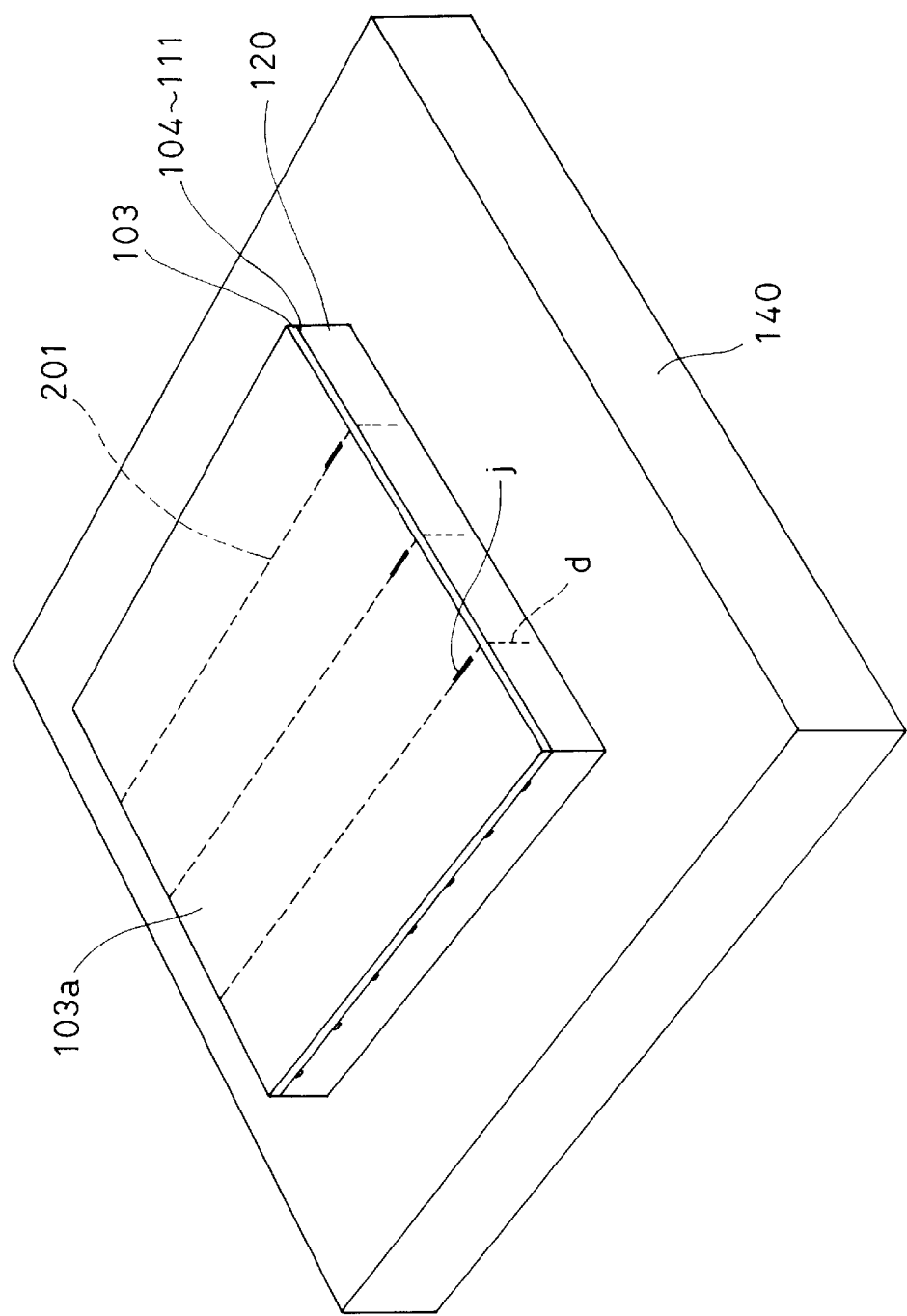
FIG. 20 is a perspective view showing a wafer for the semiconductor laser device in the fabricating step of an embodiment of the present invention.

As shown in FIG. 20, scratches "j" are formed in the n-side electrode 103$a$ in agreement with the positions of the insulating stripes 201 by the use of a diamond point, from the GaN side of the underlayer 103 of the resulting unitary body consisting of the laser structure portion and the Cu films 120.

Figure 21:
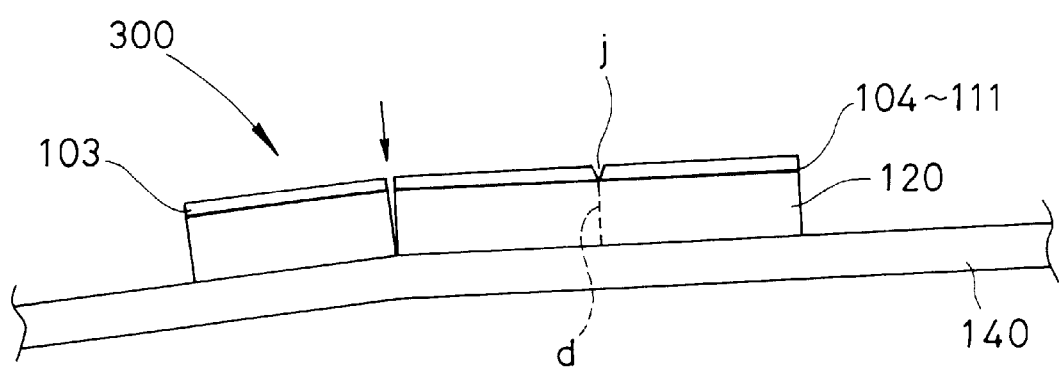
FIG. 21 is a cross section view showing a wafer for the semiconductor laser device in the fabricating step of an embodiment of the present invention.

Thereafter, as shown in FIG. 21, the holding metal plate 140 is bent, thereby cleaving the GaN film 103 and to sever the Cu films 120 at the sutures d. Thus, a plurality of laser bars 300 are formed. In this way, the underlayer 103 is cleaved at a device length pitch in a direction (as indicated by an arrow) perpendicular to the extending direction of the ridge waveguides, along with the severance of the Cu films 120.

The scribing may also be performed by point irradiation employing a high power laser.

As stated before, the Cu films 120 at the parts on the insulating stripes 201 are not perfectly integrated, so that the Cu films 120 are easily separated at the uniting parts, namely, the suture planes d. Further, when the width of the insulating stripes 201 is changed as shown in FIG. 13, the Cu films 120 can be made still easier to be severed, and hence, the cleavage can be performed even without scribing with a diamond point.

After the end of the cleaving operation, the holding metal plate 140 that supports the laser bars 300 is heated above the melting point of In, thereby to separate the individual laser bars 300 from the holding metal plate 140.

<Coating with Reflective Films>

Thereafter, if necessary, the fissured surfaces of each laser bar 300 fabricated (the cleavage planes of the multiple GaN layers 103-111) are provided with dielectric multilayer reflective films by the use of a sputtering apparatus or the like.

<Splitting into Laser Chips>

Figure 22:
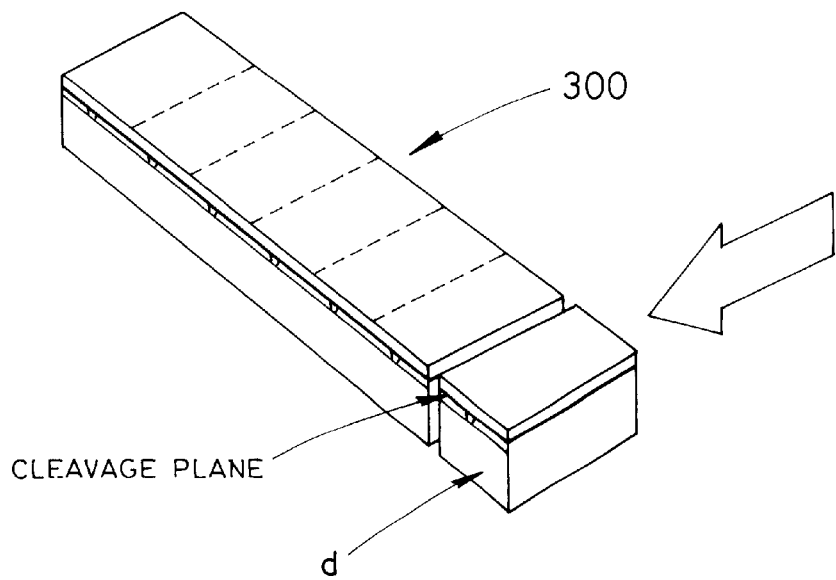
FIG. 22 is a schematic perspective view of a laser bar in the manufacturing process of a semiconductor laser in an embodiment of the present invention.

As shown in FIG. 22, each laser bar 300 is cut so as to be split into individual laser chips.

<Assemblage>

Figure 23:
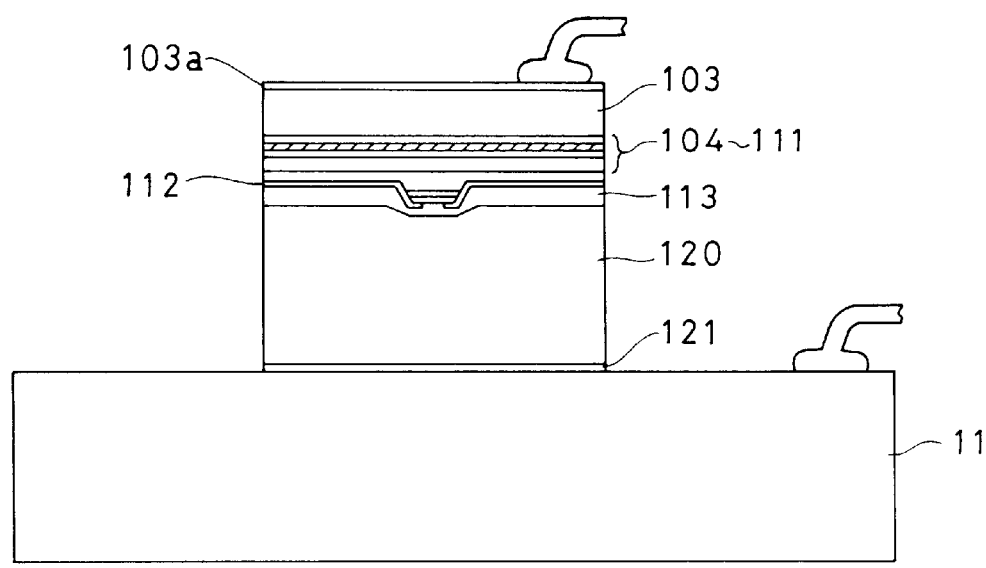
FIG. 23 is a schematic sectional view of a semiconductor laser in an embodiment of the present invention.

In a case where the laser chip fabricated according to the present invention is mounted on a heat sink, the side of the Cu film 120 is bonded onto the heat sink, and a group III nitride semiconductor laser device of refractive index waveguide type as shown in FIG. 23 is finished up via further predetermined steps. In this case the resultant device chip is conveniently assembled, because any special submount is not needed. The laser chip is equivalent to being already provided with a submount of Cu which has a very high thermal conductivity. Moreover, a distance from the light emission point of the laser to the heat sink is attained to be several tens of microns or more, so that the interference of an emitted beam with the heat sink can be avoided.

The device shown in FIG. 23 includes the chip in which the laser wafer and the Cu film 120 formed thereon by the plating are unitarily coupled, and it has the side of the Cu film 120 bonded on an electrically conductive chip carrier 11 which serves as the heat sink. The laser wafer is such that the plurality of crystal layers 104–110 made of group III nitride semiconductors $(Al_xGa_{1-x})_{1-y}In_yN$ (where $0 \leq x \leq 1$ and $0 \leq y \leq 1$ hold), and the electrode layer 113 are successively stacked on the underlayer 103 made of a group III nitride semiconductor $(Al_{x'}Ga_{1-x'})_{1-y'}In_{y'}N$ (where $0 \leq x' \leq 1$ and $0 \leq y' \leq 1$ hold). The active layer 106 is included in the stacked crystal layers. The Cu film 120 is formed by the plating. This Cu film 120 located on the side of the stacked crystal layers remote from the underlayer 103 has the suture planes of pseudo cleaving property or parting property substantially agreeing with those cleavage planes of the stacked crystal layers which are to constitute a laser resonator. The suture planes have been formed owing to electrodeposition limited by the insulating stripes 201 at the plating step. The electrode layer 113 side of the laser wafer is bonded to the heat sink chip carrier 11, and is connected to an external electrode therethrough. The laser wafer has the ridge waveguide which extends perpendicular to the cleavage planes of the nitride semiconductors (that is, normally to the drawing sheet).

As shown in FIG. 19, the laser wafer of the semiconductor laser device consists of the plurality of crystal layers; the n-type $Al_{0.1}Ga_{0.9}N$ layer 104, n-type GaN layer 105, active layer 106 mainly containing InGaN, p-type $Al_{0.2}Ga_{0.8}N$ layer 107, p-type GaN layer 108, p-type $Al_{0.1}Ga_{0.9}N$ layer 109, and p-type GaN layer 110, which are successively stacked on the n-type GaN underlayer 103. The p-type $Al_{0.1}Ga_{0.9}N$ layer 109 is formed with the ridge strip portion 202 so as to have the waveguide which extends perpendicular to the cleavage planes of the nitride semiconductors. The part of the layer 109 outside the electrode 110, 111 is covered with and protected by the insulating film 112 of $SiO_2$. The n-side electrode 103a is formed on the n-type GaN underlayer 103 of the laser, while the p-side electrode 121 is connected to the p-type GaN contact layer 110 side of the laser through the Cu film 120.

In the semiconductor laser device, light is generated by the recombination of electrons and holes in the active layer 106. The n-type GaN layer 105 and the p-type GaN layer 108 are guide layers, into which the light generated in the active layer 106 is guided. Besides, when bandgaps of the guide layers 105 and 108 are set greater than that of the active layer 106, these guide layers are effective to confine the electrons and the holes within the active layer 106. The p-type $Al_{0.2}Ga_{0.8}N$ layer 107 is a barrier layer which enhances the confinement of injected carriers (especially, electrons) still further. The n-type $Al_{0.1}Ga_{0.9}N$ layer 104 and the p-type $Al_{0.1}Ga_{0.9}N$ layer 109 are cladding layers which are formed having refractive indices lower than those of the guide layers 105, 108. Thus, the light is guided on the basis of the index differences of the cladding layers 104, 109 relative to the guide layers 105, 108. The ridge stripe portion 202 is provided in order to laterally confine the generated light in such a way that a step in the lateral direction of the laser device is formed in the effective refractive index of the cladding layer 109 by changing the thickness thereof.

The above embodiment has been described concerning the device in which the laser structure is formed on the A-plane sapphire substrate. It is also possible, however, to fabricate a device in which the ridge type laser structure is formed on a C-plane sapphire substrate.

According to the present invention, the light irradiation enables the removal of a substrate for the growth, so that the laser cavity can be formed by the natural cleavage of the nitride semiconductors being the constituent semiconductor materials of the laser device. Thus, automatically flat reflector surfaces are obtained. As a result, a continuous laser driving of device is achieved, and a practical device lifetime is ensured. Furthermore, both the electrodes are permitted to be bonded to the electrically conductive substrate, and electrode structures are simplified.

What is claimed is:

1. A method of manufacturing a nitride semiconductor laser having a plurality of crystal layers made of group III nitride semiconductors including an active layer and successively stacked on an underlayer made of a group III nitride semiconductor, comprising the steps of:

forming a plurality of crystal layers on the underlayer formed on a first substrate;

forming an electrode layer on an outermost surface of said crystal layers;

plating with metal the electrode layer to form an auxiliary substrate with which the plurality of crystal layers is lined;

irradiating an interface between the first substrate and said underlayer with light to form a region of decomposed substances of the nitride semiconductor;

delaminating said underlayer that supports said crystal layers, from said first substrate along the decomposed substance region; and cleaving said underlayer with said crystal layers thereon together with the auxiliary substrate to form cleaved mirrors.

2. A method as defined in claim 1, further comprising a step of forming insulating stripes which extend parallel to an extending direction of the cleavage planes to be formed in said nitride semiconductors, on said electrode layer before plating of the metal so that depositions of the metal are forestalled on the insulating stripes.

3. A method as defined in claim 2, wherein scribing lines are formed on said crystal layers parallel to the insulating stripes, whereupon said underlayer that supports said crystal layers is cleaved at said cleavage step.

4. A method as defined in claim 1, wherein the auxiliary substrate is made of copper.

5. A method as defined in claim 1, wherein, in said light irradiation step, light to be applied is selected from a group of light having a wavelength which passes through said first substrate and which is absorbed by a part of said underlayer vicinal to the interface.

6. A method ad defined in claim 1, wherein at said light irradiation step, the irradiation is performed uniformly over the interface between the first substrate and the underlayer or by scanning the interface with a spot or with a line of sight.

7. A method as defined in claim 1, wherein said crystal layer formation step includes the step of forming waveguides which extend perpendicular to the cleavage planes to be formed in said nitride semiconductors.

8. A method as defined in claim 1, wherein said crystal layers are formed by metal organic chemical vapor deposition.

9. A method as defined in claim 1, wherein, in said light irradiation step, light to be applied is an ultraviolet ray generated from a frequency quadrupled YAG laser.

10. A method for separating a first substrate from a nitride semiconductor wafer which is obtained by successively stacking at least one crystal layer made of group III nitride semiconductor on the first substrate, comprising the steps of:

plating with metal an outermost surface of the crystal layer to form an auxiliary substrate with which the crystal layer is lined;

irradiating an interface between the first substrate and said crystal layer through the first substrate to form a region of decomposed substances of the nitride semiconductor; and delaminating said crystal layer together with the auxiliary substrate from said first substrate along the decomposed substance region.

11. A method as defined in claim 10, further comprising a step of forming an electrode layer on the outermost surface of said crystal layer before plating of the metal so that the electrode layer is plated with the metal.

12. A method as defined in claim 10, wherein the auxiliary substrate is made of copper.

13. A method as defined in claim 10, wherein, in said light irradiation step, light to be applied is selected from a group of light having a wavelength which passes through said first substrate and which is absorbed by a part of said crystal layer vicinal to the interface.

14. A method as defined in claim 10, wherein at said light irradiation step, the light is applied onto an interface between said first substrate and said crystal layer, uniformly or while scanning said interface in a spot or line shape.

15. A method as defined in claim 10, wherein, in said light irradiation step, light to be applied is an ultraviolet ray generated from a frequency quadrupled YAG laser.

* * * * *